United States Patent
Chen

(10) Patent No.: US 12,439,554 B2
(45) Date of Patent: Oct. 7, 2025

(54) COOLANT GUIDING STRUCTURE AND ELECTRONIC ASSEMBLY

(71) Applicant: Fulian Precision Electronics (Tianjin) Co., LTD., Tianjin (CN)

(72) Inventor: Xiang-Wu Chen, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 202 days.

(21) Appl. No.: 18/216,716

(22) Filed: Jun. 30, 2023

(65) Prior Publication Data

US 2024/0008222 A1    Jan. 4, 2024

(30) Foreign Application Priority Data

Jul. 1, 2022    (CN) .......................... 202221687283.8

(51) Int. Cl.
*H05K 7/20* (2006.01)

(52) U.S. Cl.
CPC ..... *H05K 7/20272* (2013.01); *H05K 7/20254* (2013.01)

(58) Field of Classification Search
None
See application file for complete search history.

(56) References Cited

U.S. PATENT DOCUMENTS

| | | | |
|---|---|---|---|
| 4,765,397 A * | 8/1988 | Chrysler | H01L 23/473 257/E23.098 |
| 5,077,601 A * | 12/1991 | Hatada | H01L 23/467 174/15.1 |
| 5,763,950 A * | 6/1998 | Fujisaki | H01L 23/3672 257/E29.022 |
| 6,678,157 B1 * | 1/2004 | Bestwick | H05K 7/20163 165/104.34 |
| 7,096,678 B2 * | 8/2006 | Petroski | G06F 1/20 257/E23.102 |
| 7,310,228 B2 * | 12/2007 | Chen | H05K 7/20154 361/679.48 |
| 7,382,613 B2 * | 6/2008 | Vinson | G06F 1/20 361/679.48 |
| 8,300,409 B2 * | 10/2012 | Wei | H01L 23/467 361/689 |
| 8,913,385 B2 * | 12/2014 | Downing | H01L 23/467 361/679.48 |
| 9,310,856 B2 * | 4/2016 | Doll | H05K 7/20736 |

(Continued)

*Primary Examiner* — Courtney L Smith
(74) *Attorney, Agent, or Firm* — ScienBiziP, P.C.

(57) ABSTRACT

A coolant guiding structure can guide a coolant to a plurality of electronic components spaced from each other. The coolant guiding structure includes a housing, a plurality of first baffles, a plurality of second baffles, and a plurality of spoiler assemblies. The housing includes a liquid inlet and a liquid outlet. The liquid inlet can introduce the coolant into the housing, and the liquid outlet can discharge the coolant out of the housing. A first opening is formed between two adjacent first baffles, a second opening is formed between two adjacent second baffles, and a guide channel is formed between the first opening and the second opening. Each first baffle and a corresponding second baffle can accommodate one electronic component therebetween. At least two spoiler assemblies are disposed in the guide channel. The present disclosure further provides an electronic assembly.

18 Claims, 6 Drawing Sheets

(56) References Cited

U.S. PATENT DOCUMENTS

| | | | |
|---|---|---|---|
| 12,178,007 B2* | 12/2024 | Uchibe | H05K 7/20254 |
| 2009/0190302 A1* | 7/2009 | Bhattacharya | F28F 13/12 |
| | | | 165/80.3 |
| 2011/0222239 A1* | 9/2011 | Dede | F28F 21/06 |
| | | | 361/689 |

* cited by examiner

COOLANT GUIDING STRUCTURE AND ELECTRONIC ASSEMBLY

FIELD

The subject matter herein generally relates to liquid cooling, and more particularly, to a coolant guiding structure and an electronic assembly.

BACKGROUND

Electronic components may generate heat when working. Thus, the electronic components can be immersed in a coolant for cooling purpose. When the electronic components are immersed in the coolant, the coolant that having a high viscosity may hinder the uniform distribution of the coolant, reduces the heat conduction efficiency, and is not conducive to the heat dissipation of the electronic components. Therefore, there is a room for improvement in the art.

BRIEF DESCRIPTION OF THE DRAWINGS

Implementations of the present technology will now be described, by way of example only, with reference to the attached figures.

DETAILED DESCRIPTION

Figure 1:
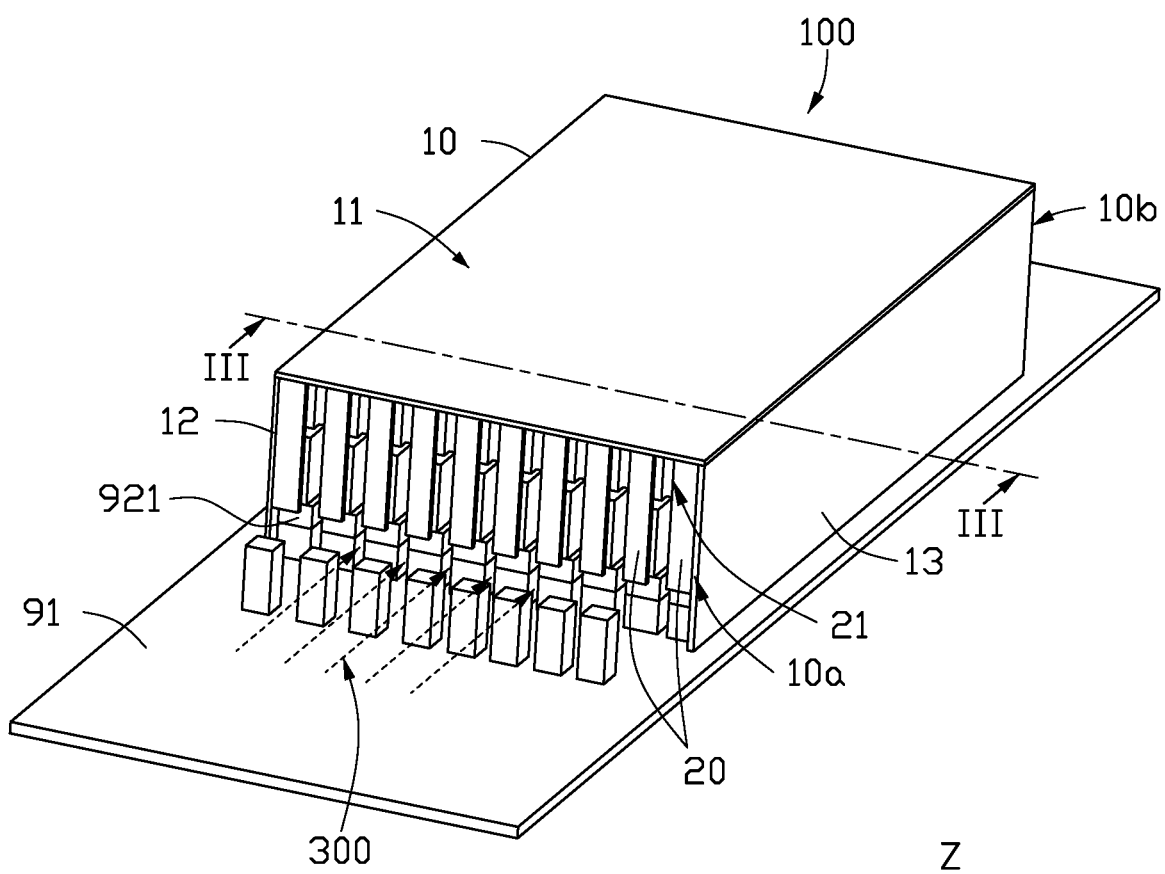
FIG. 1 is a diagrammatic view of an embodiment of an electronic assembly including a coolant guiding structure according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Figure 2:
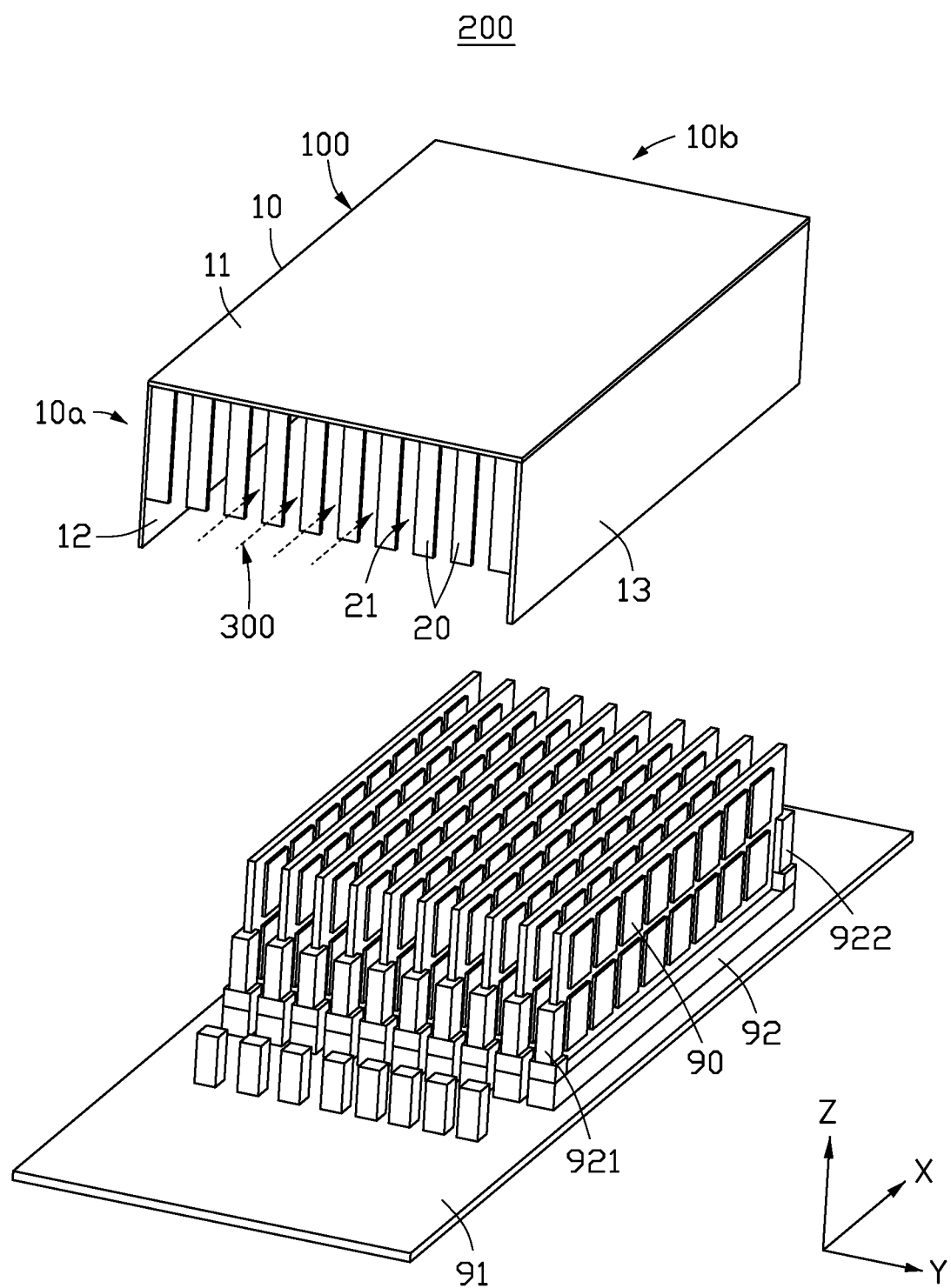
FIG. 2 is an exploded view of the electronic assembly of FIG. 1.
Figure 3:
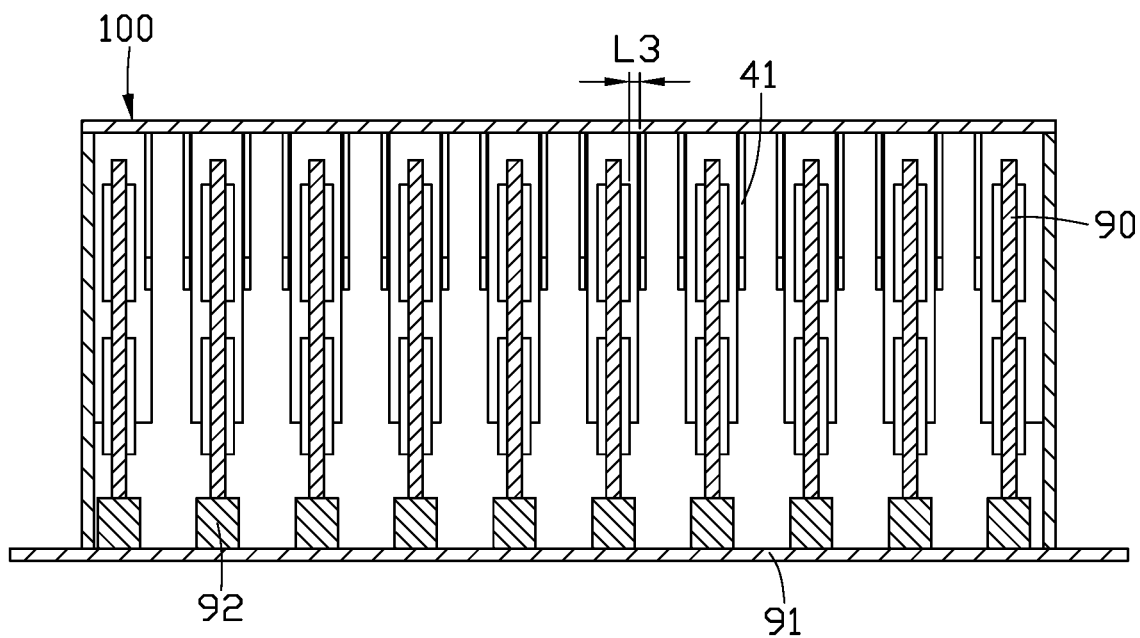
FIG. 3 is a cross-sectional view along line III-III of FIG. 1.

Referring to FIGS. 1, 2, and 3, an electronic assembly 200 is provided according to an embodiment of the present disclosure. The electronic assembly 200 includes a circuit board 91, a plurality of electronic components 90, and a coolant guiding structure 100. The electronic components 90 are spaced from each other on the circuit board 91, and the coolant guiding structure 100 is disposed on the electronic components 90 and the circuit board 91.

Figure 4:
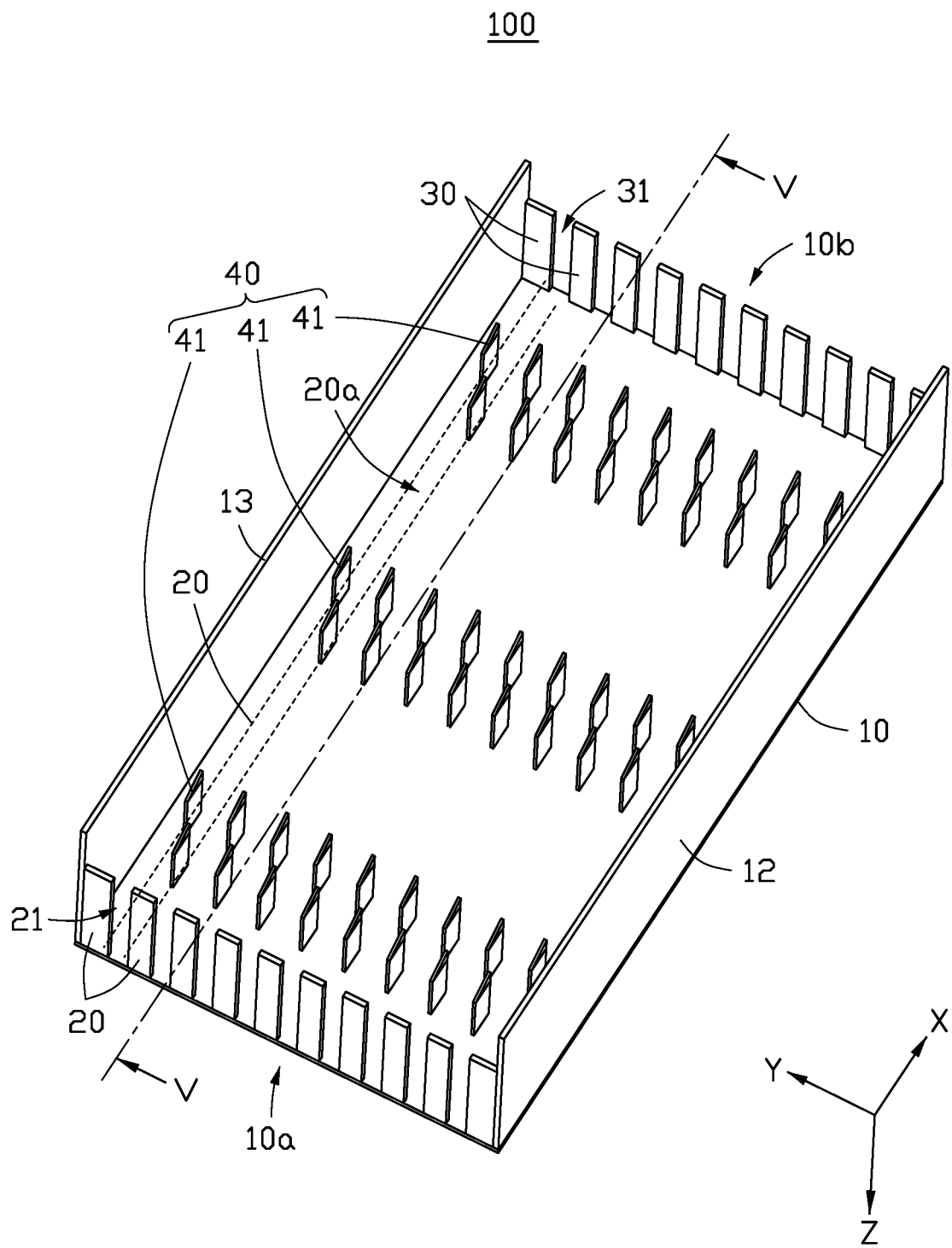
FIG. 4 is a diagrammatic view of the coolant guiding structure of FIG. 1 from another angle.

Referring to FIG. 4, the coolant guiding structure 100 can guide a coolant 300 to the electronic components 90. Both the electronic components 90 and the coolant guiding structure 100 are immersed in the coolant 300. Through the guiding function of the coolant guiding structure 100, the turbulence characteristic of the coolant 300 is improved to improve heat transfer efficiency. In some embodiments, each of the electronic components 90 can be a memory component. The coolant guiding structure 100 includes a housing 10, a plurality of first baffles 20, a plurality of second baffles 30, and a plurality of spoiler assemblies 40. The first baffles 20, the second baffles 30, and the spoiler assemblies 40 are connected to the housing 10.

The housing 10 can cover an exterior of the electronic components 90 and connect to the circuit board 91. The housing 10 includes a liquid inlet 10a and a liquid outlet 10b spaced from each other along a first direction X. The liquid inlet 10a can introduce the coolant 300 into the housing 10, and the liquid outlet 10b can discharge the coolant 300 out of the housing 10.

In some embodiments, the housing 10 includes a cover plate 11, and a first side plate 12, and a second side plate 13. The first side plate 12 and the second side plate 13 are connected to the cover plate 11, and are spaced from each other to form the liquid inlet 10a and the liquid outlet 10b at opposite ends of the cover plate 11 along the first direction X. The electronic components 90 can be disposed between the first side plate 12 and the second side plate 13. The cover plate 11 is supported by the first side plate 12 and the second side plate 13 to cover the electronic components 90.

Referring to FIG. 4, in some embodiments, the first baffles 20 are connected to the end of the cover plate 11 adjacent to the liquid inlet 10a. The first baffles 20 are spaced from each other. A first opening 21 is formed between two adjacent first baffles 20. The second baffles 30 are connected to another end of the cover plate 11 adjacent to the liquid outlet 10b. The second baffles 30 are spaced from each other. A second opening 31 is formed between two adjacent second baffles 30.

Each first baffle 20 and one of the second baffles 30 are aligned with and corresponding to each other along the first direction X. Each first baffle 20 and the corresponding second baffle 30 can accommodate a corresponding one of the electronic components 90 therebetween. Each first opening 21 and one second opening 31 are aligned with and corresponding to each other along the first direction X. Each first opening 21 and the corresponding second opening 31 cooperatively form a guide channel 20a. Each guide channel 20a is provided with an electronic component 90 on both sides along the second direction Y. The coolant 300 is introduced into the guide channels 20a from the first openings 21 and flows toward the second openings 31, and finally is discharged through the second opening 31. When the coolant 300 flows through the guide channels 20a, the coolant 300 is in contact with the electronic components 90 disposed on both sides of each guide channel 20a to exchange heat, so as to dissipate the heat from the electronic components 90.

In some embodiments, the coolant guiding structure 100 includes ten first baffles 20, ten second baffles 30, nine first openings 21, nine second openings 31, and nine guide channels 20a.

In some embodiments, each electronic component 90 disposed between the first baffle 20 and the corresponding second baffle 30 further abuts against the cover plate 11, so that the guide channels 20a are independent from each other.

In some embodiments, the first baffles 20 are spaced from each other by a same distance, so that the first openings 21 are spaced from each other by a same distance. Thus, the coolant 300 can be uniformly introduced into each guide channel 20a through the first openings 21 to improve the uniformity of heat dissipation. Furthermore, the second baffles 30 are spaced from each other by a same distance, so that the second openings 31 are spaced from each other by a same distance. Thus, the coolant 300 can be evenly discharged from each guide channel 20a through the second openings 31.

The first side plate 12 and the second side plate 13 are spaced from each other along a second direction Y, and the second direction Y intersects the first direction X. In the embodiment, the second direction Y is perpendicular to the first direction X. The first baffles 20 are spaced from each other along the second direction Y, and the second baffles 30 are spaced from each other along the second direction Y, so that each electronic component 90 extending along the first direction X is accommodated between each first baffle 20 and the corresponding second baffle 30.

In some embodiments, along the second direction Y, a width of each first baffle 20 is greater than or equal to a width of the corresponding electronic component 90, and a width of each second baffle 30 is greater than or equal to the width of the corresponding electronic component 90. Each electronic component 90 is accommodated between the first baffle 20 and the corresponding second baffle 30.

In some embodiments, the first baffle 20 adjacent to the first side plate 12 in the second direction Y and the second baffle 30 adjacent to the first side plate 12 in the second direction Y are connected to the first side plate 12 to improve a stability of the first side plate 12. The first baffle 20 adjacent to the second side plate 13 in the second direction Y and the second baffle 30 adjacent to the second side plate 13 in the second direction Y are connected to the second side plate 13 to improve a stability of the second side plate 13.

In some embodiments, the first baffle 20 and the second baffle 30 extend outward from the cover plate 11 along a third direction Z, and the third direction Z, the first direction X, and the second direction Y are perpendicular to each other. One side of each electronic component 90 is adjacent to the cover plate 11, and another side of each electronic component 90 away from the cover plate 11 protrudes from the first baffle 20 and the second baffle 30 along the third direction Z. The protruding side of each electronic component 90 is connected to the circuit board 91.

In some embodiments, a cross-sectional view of each first baffle 20 perpendicular to the first direction X is rectangular, and a cross-sectional view of each second baffle 30 perpendicular to the first direction X is rectangular.

Referring to FIG. 4, in some embodiments, the spoiler assemblies 40 is connected to the cover plate 11 and disposed between the first side plate 12 and the second side plate 13. At least two spoiler assemblies 40 spaced from each other along the second direction Y are disposed in each guide channel 20a. Each spoiler assembly 40 includes a plurality of spoilers 41 spaced from each other along the first direction X. The spoilers 41 of two adjacent spoiler assemblies 40 are staggered with each other in the first direction X, that is, projections of the spoilers 41 of two adjacent spoiler assemblies 40 in the second direction Y are spaced from each other. The staggered arrangement of the spoilers 41 can disturb the coolant 300 flowing in a steady state in the guide channels 20a, improve the disturbance characteristic of the spoilers 41 to the coolant 300, and further improve the heat conduction and dissipation efficiency.

Figure 5:
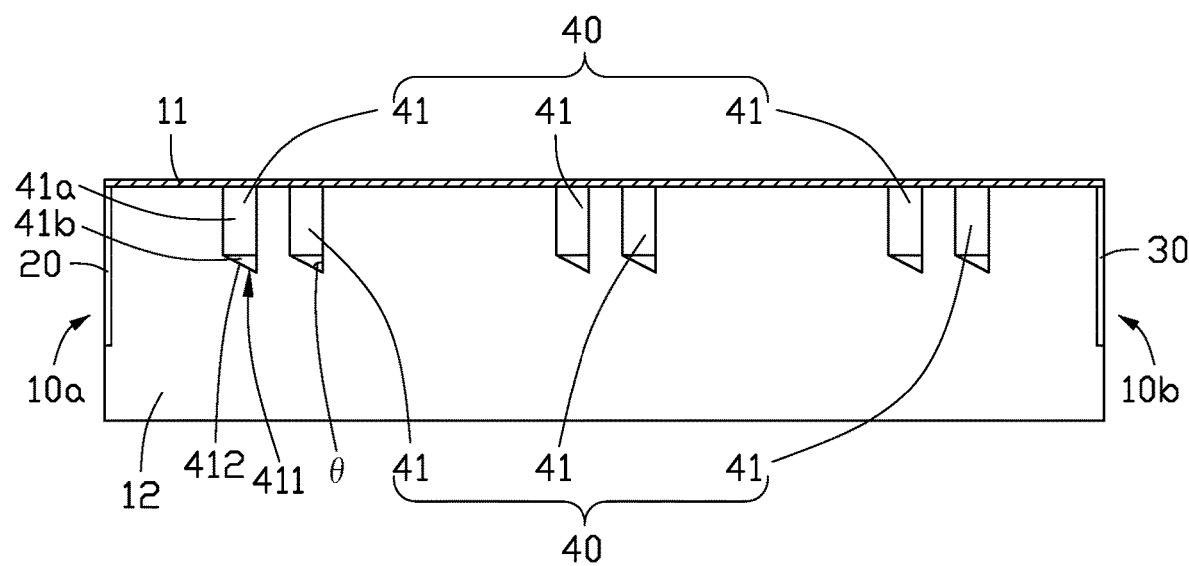
FIG. 5 is a cross-sectional view along line V-V of FIG. 4.

Referring to FIG. 5, in some embodiments, each spoiler 41 is sheet-shaped. Each spoiler 41 includes a first end 410 connected to the cover plate 11 and a second end 411 away from the cover plate 11. A thickness direction of the spoilers 41 is parallel to the second direction Y. The spoilers 41 of one guide channel 20a is parallel to the spoilers 41 of the other guide channel 20a, so as to insert the electronic components 90. In some embodiments, a thickness of each spoiler 41 along the second direction Y is 1 mm.

In some embodiments, the second end 411 of the spoiler 41 is provided with an inclined edge 412 inclined towards the liquid inlet 10a, and the inclined edge 412 can be in contact with the coolant 300 and improve the turbulence characteristic of the spoilers 41 to the coolant 300. An angle $\theta$ between the inclined edge 412 and the second direction Y is in a range from 30 degrees to 60 degrees.

The angle $\theta$ between the inclined edge 412 and the second direction Y can be one of 30 degrees, 35 degrees, 40 degrees, 45 degrees, 50 degrees, 55 degrees, 60 degrees, and the like.

In some embodiments, each spoiler 41 includes a supporting portion 41a and a spoiler portion 41b. An end of the supporting portion 41a is connected to the cover plate 11, and the spoiler portion 41b is connected to another end of the supporting portion 41a away from the cover plate 11. Viewed along the second direction Y, the supporting portion 41a is rectangular, and the spoiler portion 41b is right triangle. An inclined side of the spoiler portion 41b is the inclined edge 412.

In some embodiments, the supporting portion 41a and the spoiler portion 41b are integrally formed to improve the strength of the spoilers 41.

Figure 6:
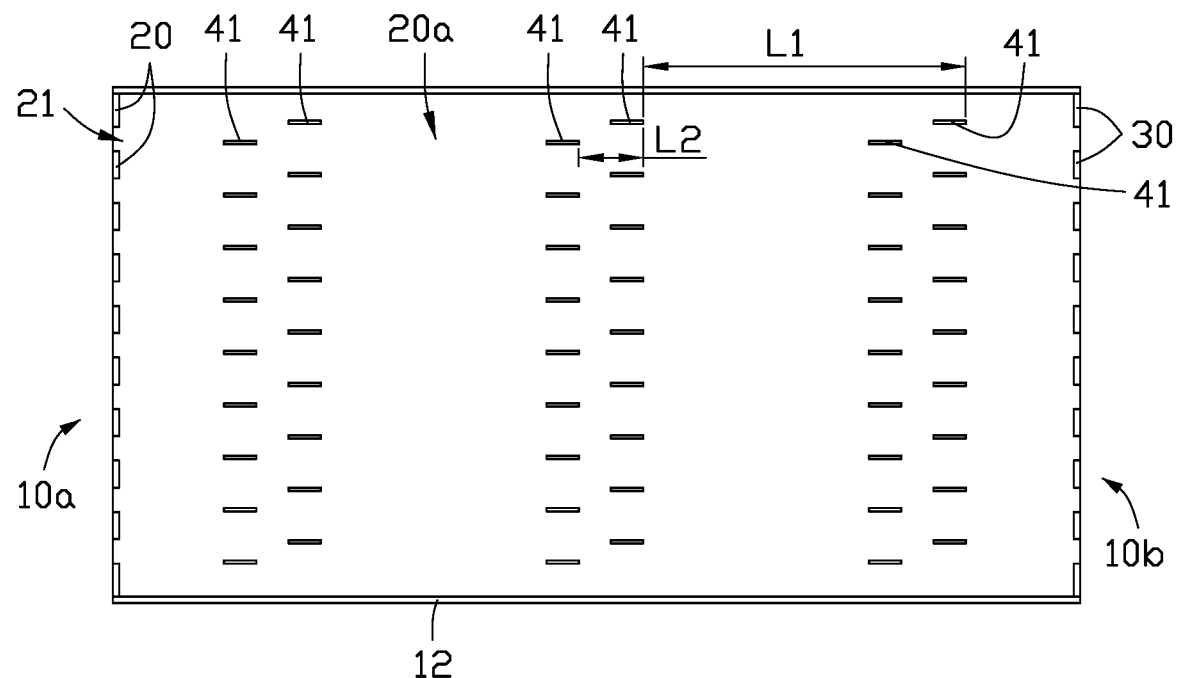
FIG. 6 is a bottom view of the coolant guiding structure of FIG. 4.

Referring to FIG. 6, in some embodiments, the spoilers 41 in each spoiler assembly 40 are spaced from each other by a same distance along the first direction X, so that the spoilers 41 are evenly distributed in the guide channels 20a along the first direction X, so as to continuously improve the disturbance characteristic of the spoilers 41 to the coolant 300 during the flow of the coolant 300.

Referring to FIG. 6, along the first direction X, a first distance L1 between two adjacent spoilers 41 in each spoiler assembly 40 is in a range from 20 mm to 40 mm.

The first distance L1 can be one of 20 mm, 25 mm, 30 mm, 35 mm, 40 mm, and the like.

In some embodiments, along the first direction X, a second distance L2 between two adjacent spoilers 41 staggered in two spoiler assemblies 40 is in a range from 10 mm to 20 mm.

The second distance L2 can be one of 10 mm, 15 mm, 20 mm, and the like.

In some embodiments, referring to FIG. 3, a third distance L3 between the spoiler assembly 40 and an adjacent one of the electronic components 90 is less than or equal to 1 mm, so that the disturbed coolant 300 can contact the electronic components 90 and improve the heat conduction efficiency.

The third distance L3 can be one of 0.1 mm, 0.2 mm, 0.3 mm, 0.4 mm, 0.5 mm, 0.6 mm, 0.7 mm, 0.8 mm, 0.9 mm, 1 mm, and the like.

In some embodiments, the housing 10 covers an exterior of the electronic components 90 and is connected to the circuit board 91. One side of the first side plate 12 is connected to the circuit board 91, and the other side is connected to and support the cover plate 11. One side of the second side plate 13 is connected to the circuit board 91, and the other side is connected to and support the cover plate 11. Along the second direction Y, the electronic components 90 are disposed between the first side plate 12 and the second side plate 13. Along the third direction Z, the electronic components 90 are disposed between the cover plate 11 and the circuit board 91.

Referring to FIGS. 1 and 2, in some embodiments, a plurality of slots 92 are defined on the circuit board 91. Each electronic component 90 is accommodated in the corresponding slot 92. Along the first direction X, one end of each slot 92 adjacent to the liquid inlet 10a is provided with a first portion 921 protruding from the electronic components 90. One end of each first baffle 20 is connected to the housing 10, and the other end is attached to the first portion 921. One end of each slot 92 adjacent to the liquid outlet 10b is provided with a second portion 922 protruding from the electronic components 90. One end of each second baffle 30 is connected to the housing 10, and the other end is attached to the second portion 922.

In some embodiments, along the second direction Y, a width of one first baffle 20 is equal to a width of the corresponding first portion 921, and a width of one second baffle 30 is equal to the width of the corresponding second portion 922.

In other embodiments, each electronic component 90 can be arc-shaped, that is, along the third direction Z, a projection of each electronic component 90 on the circuit board 91 is arc-shaped, and each guide channel 20a can also be arc-shaped.

The coolant guiding structure 100 and the electronic assembly 200 provided with the coolant guiding structure 100, the electronic components 90 are provided on both sides of each guide channel 20a. The coolant 300 is introduced into the guide channels 20a from the first openings 21 and flows toward the second openings 31, and finally is discharged through the second opening 31. When the coolant 300 flows through the guide channels 20a, the coolant 300 in contact with the electronic components 90 disposed on both sides of each guide channel 20a to exchange heat, so as to dissipate the heat from the electronic components 90. The staggered arrangement of the spoilers 41 can disturb the coolant 300 flowing in a steady state in the guide channels 20a, improve the disturbance characteristic of the spoilers 41 to the coolant 300, and further improve the heat conduction and dissipation efficiency.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. 1. A coolant guiding structure configured to guide a coolant to a plurality of electronic components spaced from each other, the coolant guiding structure comprising:
    a housing configured to cover the plurality of electronic components, the housing comprising a liquid inlet and a liquid outlet spaced from the liquid inlet along a first direction, the liquid inlet configured to introduce the coolant into the housing, and the liquid outlet configured to discharge the coolant out of the housing;
    a plurality of first baffles spaced from each other at the liquid inlet, and a first opening formed between two adjacent of the plurality of first baffles;
    a plurality of second baffles spaced from each other at the liquid outlet, a second opening formed between two adjacent of the plurality of second baffles, each of the plurality of first baffles and a corresponding one of the plurality of second baffles configured to accommodate one of the plurality of electronic components therebetween; and
    a plurality of spoiler assemblies, each of the plurality of spoiler assemblies comprising a plurality of spoilers spaced from each other along the first direction;
    wherein a guide channel is formed between the first opening and the second opening, and at least two of the plurality of spoiler assemblies spaced from each other along a second direction are disposed in the guide channel, the second direction intersects the first direction, and two of the plurality of spoilers of two adjacent of the plurality of spoiler assemblies are staggered with each other in the first direction;
    the housing further comprises a cover plate, a first side plate connected to the cover plate, and a second side plate connected to the cover plate, the first side plate and the second side plate are spaced from each other to form the liquid inlet and the liquid outlet at opposite ends of the cover plate along the first direction; the first side plate is connected to one of the plurality of first baffles adjacent to the first side plate and one of the plurality of second baffles adjacent to the first side plate, and the second side plate is connected to one of the plurality of first baffles adjacent to the second side plate and one of the plurality of second baffles adjacent to the first side plate.

2. The coolant guiding structure of claim 1, wherein the plurality of first baffles is spaced from each other by a same distance, and the plurality second baffles is spaced from each other by a same distance.

3. The coolant guiding structure of claim 1, wherein the plurality of first baffles is connected to one of the opposite ends of the cover plate adjacent to the liquid inlet, the plurality of second baffles is connected to another one of the opposite ends of the cover plate adjacent to the liquid outlet, and the plurality of spoiler assemblies is connected to the cover plate and disposed between the first side plate and the second side plate.

4. The coolant guiding structure of claim 3, wherein the first side plate and the second side plate are spaced from each other along the second direction, the plurality of first baffles is spaced from each other along the second direction, and the plurality of second baffles is spaced from each other along the second direction.

5. The coolant guiding structure of claim 1, wherein each of the plurality of spoilers is provided with an inclined edge inclined towards the liquid inlet, and an angle between the inclined edge and the second direction is in a range from 30 degrees to 60 degrees.

6. The coolant guiding structure of claim 5, wherein each of the plurality of spoilers comprises a supporting portion and a spoiler portion, an end of the supporting portion is connected to the cover plate, the spoiler portion is connected to another end of the supporting portion away from the cover plate, and
    viewed along the second direction, the supporting portion is rectangular, the spoiler portion is right triangle, and the inclined edge is one side of the spoiler.

7. The coolant guiding structure of claim 1, wherein along the first direction, a first distance between two adjacent of the plurality of spoilers in each of the plurality of spoiler assemblies is in a range from 20 mm to 40 mm, a second distance between two adjacent of the plurality of spoilers in two of the plurality of spoiler assemblies is in a range from 10 mm to 20 mm.

8. The coolant guiding structure of claim 1, wherein a third-distance between each of the plurality of spoiler assemblies and an adjacent one of the plurality of electronic components is less than or equal to 1 mm.

9. The coolant guiding structure of claim 1, wherein the second direction is perpendicular to the first direction.

10. An electronic assembly comprising:
a circuit board;
a plurality of electronic components spaced from each other and disposed on the circuit board; and
a coolant guiding structure comprising:
a housing configured to cover the plurality of electronic components, the housing comprising a liquid inlet and a liquid outlet spaced from the liquid inlet along a first direction, the liquid inlet configured to introduce the coolant into the housing, and the liquid outlet configured to discharge the coolant out of the housing;
a plurality of first baffles spaced from each other at the liquid inlet, and a first opening formed between two adjacent of the plurality of first baffles;
a plurality of second baffles spaced from each other at the liquid outlet, a second opening formed between two adjacent of the plurality of second baffles, each of the plurality of first baffles and a corresponding one of the plurality of second baffles configured to accommodate one of the plurality of electronic components therebetween; and
a plurality of spoiler assemblies, each of the plurality of spoiler assemblies comprising a plurality of spoilers spaced from each other along a first direction;
wherein a guide channel is formed between the first opening and the second opening, and at least two of the plurality of spoiler assemblies spaced from each other along a second direction are disposed in the guide channel, the second direction intersects the first direction, and two of the plurality of spoilers of two adjacent of the plurality of spoiler assemblies are staggered with each other in the first direction;
the housing further comprises a cover plate, a first side plate connected to the cover plate, and a second side plate connected to the cover plate, the first side plate and the second side plate are spaced from each other to form the liquid inlet and the liquid outlet at opposite ends of the cover plate along the first direction; the first side plate is connected to one of the plurality of first baffles adjacent to the first side plate and one of the plurality of second baffles adjacent to the first side plate, and the second side plate is connected to one of the plurality of first baffles adjacent to the second side plate and one of the plurality of second baffles adjacent to the first side plate.

11. The electronic assembly of claim 10, wherein a plurality of slots is defined on the circuit board, each of the plurality of electronic components is accommodated in corresponding of the plurality of slots,
along the first direction, one end of each of the plurality of slots adjacent to a corresponding one of the plurality of liquid inlets is provided with a first portion protruding from a corresponding one of the plurality of electronic components,
one end of each of the plurality of first baffles is connected to the housing, and another end of each of the plurality of first baffles is attached to the first portion,
one end of each of the plurality of slots adjacent to a corresponding one of the plurality of liquid outlet is provided with a second portion protruding from a corresponding one of the plurality of electronic components, and
one end of each of the plurality of second baffles is connected to the housing, and another end of each of the plurality of second baffles is attached to the second portion.

12. The electronic assembly of claim 10, wherein the plurality of first baffles is spaced from each other by a same distance, and the plurality second baffles is spaced from each other by a same distance.

13. The electronic assembly of claim 10, wherein the plurality of first baffles is connected to one of the opposite ends of the cover plate adjacent to the liquid inlet, the plurality of second baffles is connected to another one of the opposite ends of the cover plate adjacent to the liquid outlet, and the plurality of spoiler assemblies is connected to the cover plate and disposed between the first side plate and the second side plate.

14. The electronic assembly of claim 13, wherein the first side plate and the second side plate are spaced from each other along the second direction, the plurality of first baffles is spaced from each other along the second direction, and the plurality of second baffles is spaced from each other along the second direction.

15. The electronic assembly of claim 10, wherein each of the plurality of spoilers is provided with an inclined edge inclined towards the liquid inlet; and an angle between the inclined edge and the second direction is in a range from 30 degrees to 60 degrees.

16. The electronic assembly of claim 15, wherein each of the plurality of spoilers comprises a supporting portion and a spoiler portion, an end of the supporting portion is connected to the cover plate, the spoiler portion is connected to another end of the supporting portion away from the cover plate; and
viewed along the second direction, the supporting portion is rectangular, the spoiler portion is right triangle, and the inclined edge is one side of the spoiler.

17. The electronic assembly of claim 10, wherein along the first direction, a first distance between two adjacent of the plurality of spoilers in each of the plurality of spoiler assemblies is in a range from 20 mm to 40 mm, a second distance between two adjacent of the plurality of spoilers in two of the plurality of spoiler assemblies is in a range from 10 mm to 20mm.

18. The electronic assembly of claim 10, wherein a distance between each of the plurality of spoiler assemblies and an adjacent one of the plurality of electronic components is less than or equal to 1 mm.

* * * * *